(12) United States Patent
Torres

(10) Patent No.: US 9,843,329 B2
(45) Date of Patent: Dec. 12, 2017

(54) MULTI-MODULUS FREQUENCY DIVIDER

(71) Applicant: NXP B.V., Eindhoven (NL)

(72) Inventor: Javier Mauricio Velandia Torres, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/288,166

(22) Filed: May 27, 2014

(65) Prior Publication Data
US 2015/0349781 A1 Dec. 3, 2015

(51) Int. Cl.
*H04B 1/38* (2015.01)
*H04L 5/16* (2006.01)
*H03K 21/02* (2006.01)
*H03B 5/12* (2006.01)
*H04B 1/40* (2015.01)
*H03K 21/08* (2006.01)

(52) U.S. Cl.
CPC ............ *H03K 21/02* (2013.01); *H03B 5/12* (2013.01); *H03K 21/08* (2013.01); *H04B 1/40* (2013.01)

(58) Field of Classification Search
CPC .............. H03L 7/18; H03L 7/08; H03B 19/00
See application file for complete search history.

(56) References Cited

U.S. PATENT DOCUMENTS

| 6,219,397 | B1 | 4/2001 | Park |
| 7,583,151 | B2 | 9/2009 | Fan et al. |
| 7,750,693 | B2 * | 7/2010 | Chu ............... H03K 3/011 327/115 |
| 8,729,931 | B1 * | 5/2014 | Khalili ............ H03K 3/0315 327/115 |
| 8,970,272 | B2 * | 3/2015 | Zhang .............. H03K 3/017 327/203 |
| 2004/0012416 | A1 * | 1/2004 | Cheung ........... H03K 3/356139 327/115 |

(Continued)

FOREIGN PATENT DOCUMENTS

| CN | 101636911 A | 1/2010 |
| CN | 101777871 A | 7/2010 |
| CN | 101834603 A | 9/2010 |
| CN | 102027678 A | 4/2011 |

OTHER PUBLICATIONS

Razavi et al. "A 13.4-GHz CMOS Frequency Divider" 1994 IEEE International Solid-State Circuits Conference, Session 10, Optical Communication, Paper TP 10.5, (1994), 3 pages.

(Continued)

*Primary Examiner* — Shuwang Liu
*Assistant Examiner* — Sung Ahn

(57) ABSTRACT

A frequency divider circuit can achieve multi-modulus operation. The frequency divider includes clocking transistor devices, memory transistor circuits, write transistor devices, and a current source bias. The clocking transistor devices receive a differential input signal having a first frequency at an input of the frequency divider. The memory transistor circuits store signals based on the differential input signal from the clocking transistor devices. The write transistor devices make a divided frequency signal available at an output terminal. The current source bias is coupled to the clocking transistor devices. The current source bias applies a bias current to adapt the frequency divider to a common-mode at the input of the frequency divider.

15 Claims, 10 Drawing Sheets

(56) References Cited

U.S. PATENT DOCUMENTS

| | | | |
|---|---|---|---|
| 2005/0285638 A1 | 12/2005 | Xie | |
| 2007/0001719 A1* | 1/2007 | Hulfachor | H03B 19/14 327/117 |
| 2007/0236267 A1* | 10/2007 | Razavi | H03K 3/356043 327/199 |
| 2008/0001645 A1* | 1/2008 | Kuroki | H03K 5/1565 327/231 |
| 2009/0284288 A1* | 11/2009 | Zhang | H03K 3/017 327/118 |
| 2009/0295436 A1* | 12/2009 | Hosokawa | H03K 23/44 327/117 |
| 2010/0013535 A1* | 1/2010 | Song | H03K 21/023 327/218 |
| 2010/0253398 A1* | 10/2010 | Seckin | H03K 23/68 327/118 |
| 2011/0187469 A1* | 8/2011 | Okada | H03B 5/12 331/117 FE |
| 2012/0081156 A1* | 4/2012 | Hesen | H03K 21/12 327/115 |
| 2012/0120992 A1* | 5/2012 | Soltanian | H03L 7/099 375/221 |

OTHER PUBLICATIONS

Ghilioni et al. "A 6.5mW Inductorless CMOS Frequency Diverby-4 Operating up to 70GHz" 2011 IEEE International Solid-State Circuits Conference, Session 16, mm-Wave Design Techniques, 16.3 (2011), 3 pages.

Hoppner, Sebastian et al.; "A low-power, robust multi-modulus frequency divider for automotive radio applications"; Mixed Design of Integrated Cicuitys & Systems, Jun. 25-27, 2009; pp. 205-209; 2009.

Li, Wenguan et al.; "A 5.5-GHz multi-modulus frequency divider in 0.35l ¼m SiGe BiCMOS technology for delta-sigma fractional-N frequency synthesizers"; IEEE, pp. 1937-1940; 2010.

Extended European Search Report, 15168718, Oct. 2, 2015.

Coleman, E. P. et al. "Process compensated low power LO divider chain with asynchronous odd integer 50% duty cycle CML dividers", 2011 IEEE Radio Frequency Integrated Circuits Symposium, 4 pgs (Jun. 2011).

Office Action for CN Counterpart Patent Application CN201510272673.7 (Sep. 4, 2017).

* cited by examiner

MULTI-MODULUS FREQUENCY DIVIDER

Modern IC for communications commonly integrates high frequency circuits for generation of the local oscillators needed for reception and transmission of data. The most common architecture includes a LC-VCO (Voltage Controlled Oscillator with an LC tank) that generates a high frequency signal which is used inside a PLL to generated accurate, low-noise clocking signals. The oscillation frequency in the VCO is normally high because it allows compact design of the LC tank and lower noise by means of subsequent frequency division.

The circuit taking the signal out from the VCO into the PLL is normally a sensitive, power-hungry buffer or divider. The main difficulty in the design of such a circuit is the required direct connection to the VCO tank that can degrade the quality, the noise and also affect the center frequency of the VCO. Additionally, the common-mode of the signal at the VCO output can generate implementation problems in the buffer increasing complexity and reducing the performance.

A second consideration is the need for frequency division of the signal. The range of frequencies that the VCO can generate is limited. Therefore, modern multiband transceivers use frequency dividers to extend the range of the VCO frequency. Using different dividers in parallel requires the use of additional multiplexing and buffers to combine the different frequency branches before accessing the receiver or transmitter blocks. All these effects result in bigger and more complex circuitry running at high frequency which means higher current consumption and larger silicon area.

Different circuits and topologies are available for frequency division. Common mode logic (CML) cells with stacked differential pairs are often used for the particular case of differential operation. Various CML flip-flops are connected together in loop to obtain the desired frequency division. The stacked differential pairs use a given input direct current (DC) level (e.g., common-mode) of every pair so that the operation point is correct and the divider can reach the optimal performance.

In some other cases, driving signals are digital rail-to-rail (or rail-rail) levels, and the technology used is fast enough to cope with an undefined biasing point. In other cases, additional buffers or biasing circuits are used. However, this presents a major limitation for applications at the output of a voltage-controlled oscillator (VCO). As the operation point of the divider and the VCO gain stage are not necessarily aligned, and the swing at the VCO output is not necessarily rail-to-rail, some additional circuitry (like buffer or biasing network) must be added. This additional circuitry can cause degradation in the performance of the divider and the VCO itself.

Embodiments of a frequency divider are disclosed. In one embodiment, the frequency divider includes clocking transistor devices, memory transistor circuits, write transistor devices, and a current source bias. The clocking transistor devices receive a differential input signal having a first frequency at an input of the frequency divider. The memory transistor circuits store signals based on the differential input signal from the clocking transistor devices. The write transistor devices make a divided frequency signal available at an output terminal. The current source bias is coupled to the clocking transistor devices. The current source bias applies a bias current to adapt the frequency divider to a common-mode at the input of the frequency divider. Other embodiments of the frequency divider are also disclosed.

Embodiments of a multiband communication circuit are also described. In one embodiment, the multiband communication circuit includes a high frequency voltage-controlled oscillator (VCO), a multimode frequency divider, and a multiband transceiver. The high frequency VCO outputs a high frequency clock signal. The multimode frequency divider includes a current source bias coupled to a voltage supply. The multiband transceiver is coupled to an output of the multimode frequency divider. Other embodiments of the multiband communication circuit are also described.

Embodiments of a method are also described. In one embodiment, the method controls a multi-modulus biased divider circuit. An embodiment of the method includes receiving an input signal at a multimode frequency divider. The method also includes applying a first current source bias to a supply voltage line of the multimode frequency divider to output a first output signal with a first divided frequency relative to the input signal. The method also includes applying a second current source bias to the supply voltage line of the multimode frequency divider to output a second output signal with a second divided frequency relative to the input signal and the first divided frequency. Other embodiments of the method are also described.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1:
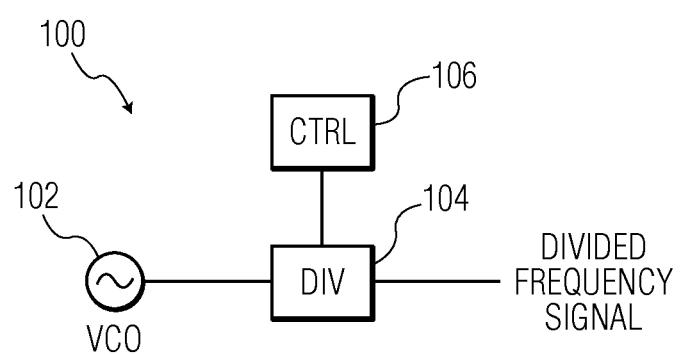
FIG. 1 depicts a schematic block diagram of one embodiment of a signal divider system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments implement a circuit suitable for frequency division at the output of a high frequency LC-VCO. Embodiments of the circuit include a differential CMOS frequency divider topology for multiple division factors that can also be combined in one single block. Embodiments of the circuit also can be used as a generic compact frequency divider.

The divider has a differential input that adapts automatically to the common-mode of the driving signal in a wide range. The divider can be used with input signals that have relatively small amplitudes, as well as input signals that have rail-rail digital amplitudes.

In some embodiments, the circuit combines different topology variations allowing different division factors with relatively low or minimum input capacitance. This makes the circuit very convenient for frequency division right after the tank of a low-noise high-frequency LC-VCO in multi-band communication circuits.

The divider can be also used as a building block in PLL's and other frequency or clock generation circuitry where frequency division at different modes may be useful. For example, some embodiments can be controlled to implement frequency division by factors of two, four, and/or six, as needed. Other embodiments may implement other division factors, or other combinations of division factors. This can avoid the need for separate dividers, RF buffers, and RF multiplexors that may be used in other circuits.

Embodiments of the frequency divider circuit described herein implement the frequency division functionality in a very compact block with advantages in term of silicon area. The divider is able to operate at high speeds (e.g., GHz) with low power and low phase noise. Therefore, the divider can be used to reduce the frequency directly at the VCO output, which allows substantial reduction in the current consumption of the high frequency blocks of a PLL.

FIG. 1 depicts a schematic block diagram of one embodiment of a signal divider system 100. The illustrated signal divider system 100 includes a VCO 102, a divider 104, and a controller 106. Although the illustrated signal divider system 100 is shown with certain components and described herein with certain functionality, other embodiments of signal divider systems may include a different number of components to implement the same or similar functionality.

In general, the VCO 102 generates a signal with a known frequency. The divider 104 is coupled to the output of the VCO 102 and derives a divided signal from the original signal output by the VCO 102. The frequency of the divided signal output by the divider 104 may have a frequency that is any fraction of the frequency of the original signal output by the VCO 102. Some common division factors are two, four, and six, meaning that the divided frequency may be one half, one fourth, or one sixth of the frequency of the original frequency for the signal generated by the VCO 102.

Many different types of dividers 104 may be implemented to divide the frequency of the original signal output by the VCO 102. In some embodiments, the divider 104 may have a fixed division factor, such as a divide-by-two, divide-by-four, or divide-by-six division factor. In other embodiments, the divider 104 may have another fixed division factor. In further embodiments, the divider 104 may have a controllable or configurable division factor such that the division factor can be controlled through switch connections or other types of controls. The controller 106 may perform these types of controlling functions. In some embodiments, the controller 106 may implement internal modes like calibration and trimming where a particular frequency is different than a frequency normally used by a product. In further embodiments, the controller 106 may apply different modes for different applications that use the same product (i.e., the same VCO frequency) if the input is divided by different factors. In one example, a specific application for implementation in the USA may use a frequency of 434 MHz (e.g., using a divide-by-four division factor), while a similar application for implementation for use in the EU may use a frequency of 868 MHz (e.g., using a divide-by-two division factor).

Figure 2:
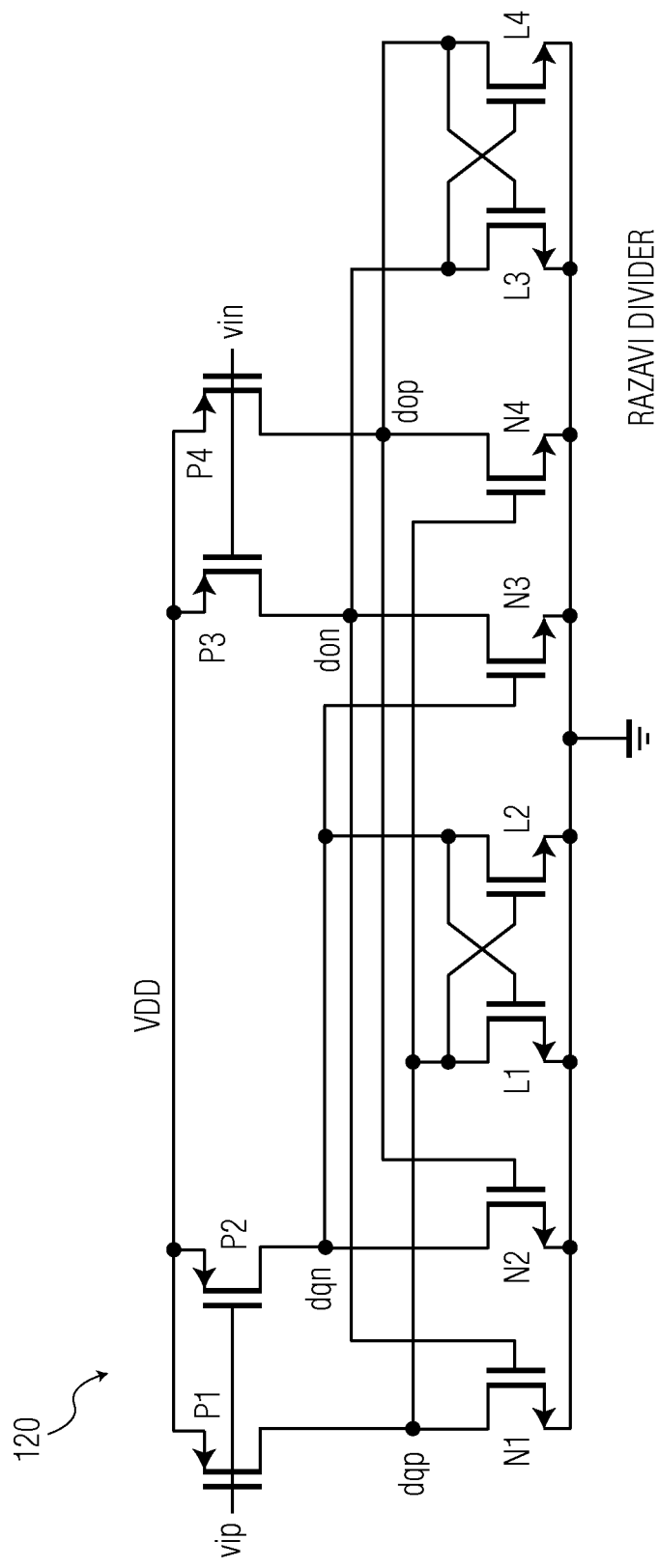
FIG. 2 depicts a schematic circuit diagram of a Razavi divider.

FIG. 2 depicts a schematic circuit diagram of a Razavi divider 120. Although this implementation of a divider is referred to herein as a Razavi divider, other names or designations may be used to identify the same or similar divider circuits. The illustrated Razavi divider 120 includes a number of transistors arranged to perform various switching and latching functions. The arrangement of these transistors facilitates generating an output signal with a divided frequency relative to a differential input signal.

In the illustrated embodiment, the input signal is provided to the PMOS transistors P1, P2, P3, and P4 at the nodes designated as vip and vin. In particular, the input signals are provided to the gates of the PMOS transistors. The source of each PMOS transistor is coupled directed to the source driving voltage VDD. The drains of the PMOS transistors are coupled to an arrangement of output nodes, memory transistor circuits, and write transistor devices.

The output nodes are designated as dqp, dqn, don, and dop. The memory transistor circuits utilize transistor pairs L1/L2 and L3/L4, which are arranged with two flip-flops interconnected to form a loop. The write transistor devices utilize transistors N1, N2, N3, and N4, each of which corresponds to an output node at the drain of the corresponding transistor. The sources of the memory transistor circuits and the write transistor devices are coupled to a ground reference.

Figure 3:
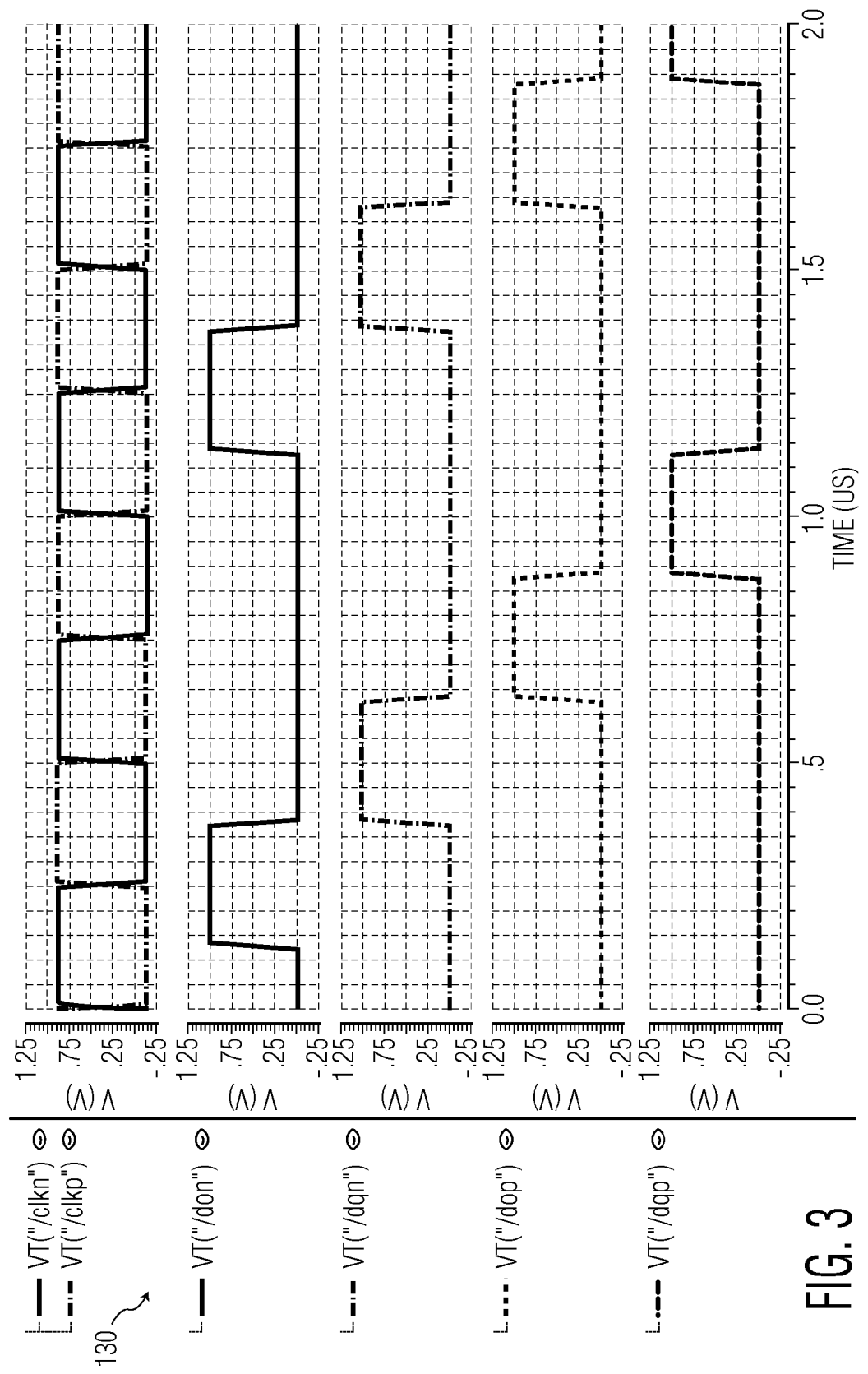
FIG. 3 depicts a signal waveform diagram of input and output signals associated with the Razavi divider of FIG. 2.

FIG. 3 depicts a signal waveform diagram 130 of input and output signals associated with the Razavi divider 120 of FIG. 2. Inverse input signals clkn and clkp are input into the divider 120. At each output node don, dqn, dop, dqp, an output signal with a divided frequency and a phase shift can be obtained.

Normally, Razavi based dividers require rail-rail digital inputs for proper operation. When the input clock goes low (i.e., PMOS active), the respective state is evaluated and updated via the writing devices Ni. When the input clock goes high (i.e., PMOS inactive), the state is stored in the cross-coupled pairs Li. The loop connection of both flip-flops causes that there is an update in the state of the outputs for every input clock edge either rising or falling.

The divider outputs have half the input frequency and duty cycle close to 25%. This means that the pulse width of the output is almost the same as the pulse width of the input clock signals. Also, there is a small time interval when both complementary nodes (dqp–dqn or dop–don) are low.

Figure 4:
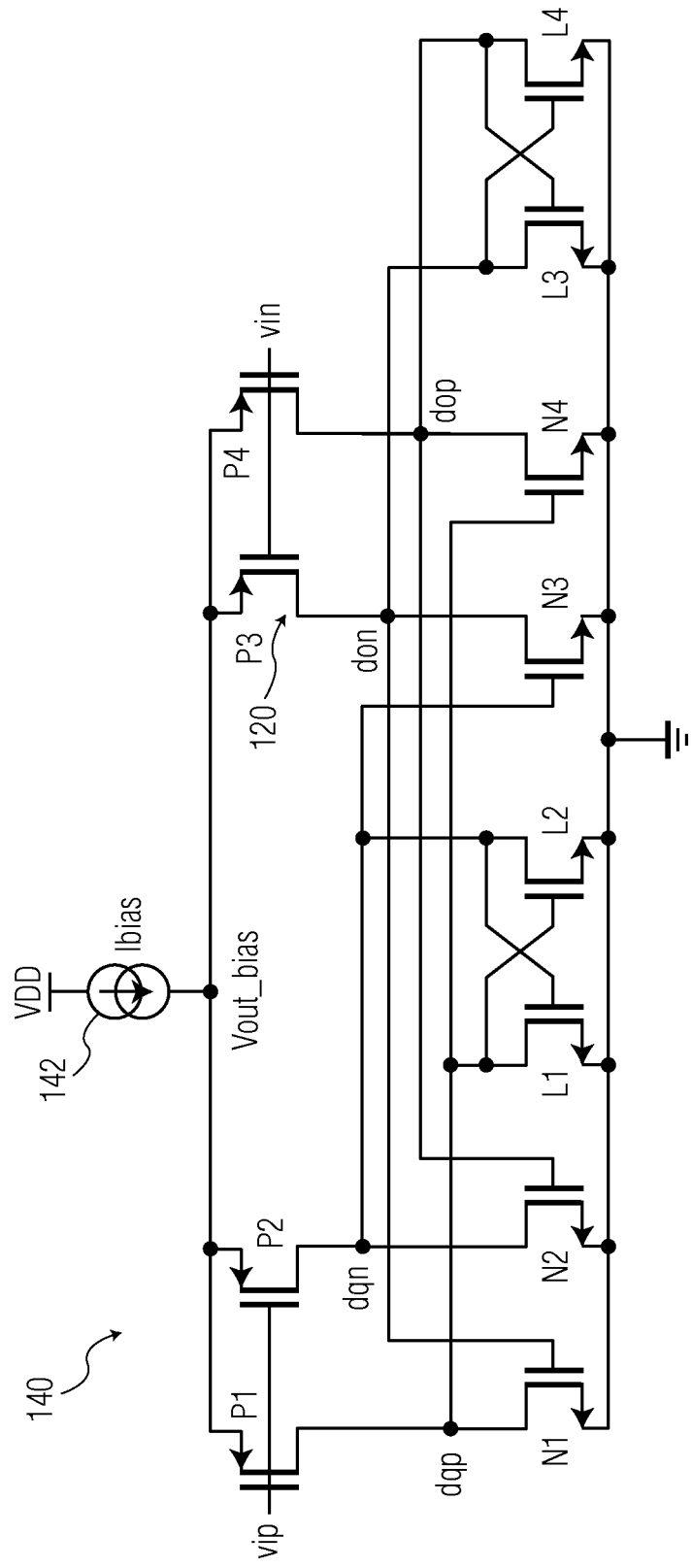
FIG. 4 depicts a schematic circuit diagram of one embodiment of a biased divider circuit for divide-by-2 frequency division.

FIG. 4 depicts a schematic circuit diagram of one embodiment of a biased divider circuit 140 for divide-by-2 frequency division. The illustrated biased divider circuit 140 includes a Razavi divider with a current source bias 142 coupled to the sources of the PMOS devices P1-P4. Although the illustrated biased divider circuit 140 is shown with certain components and described herein with certain functionality, other embodiments of biased divider circuits may include a different number of components to implement the same or similar functionality.

The modified Razavi circuit of FIG. 4 has substantially the same components and arrangements as shown in FIG. 2 and described above. This type of circuit is considered an extremely fast differential circuit without stacked differential pairs. Characteristics of this differential circuit make it suitable for modification with the current source bias 142. Consequently, the modified circuit can be used as a building block for multi-modulus operation with various division factors, as described below.

In some embodiments, the current source bias 142 provides complete direct current (DC) freedom of the input common mode and swing. Hence, the inputs may be referred to as having a free DC-mode. This biasing approach also allows flexible adaptation of the biasing point for different operation modes, which may be useful for the multi-modulus operation.

In the illustrated embodiment, the current source bias 142 Ibias allows the biased divider circuit 140 to allocate a large range of DC modes at the input. Additionally the current source bias 142 allows a real differential operation on the input signal, which results in a reduced minimum input swing for proper operation. Thus, in at least some embodiments, rail-to-rail digital levels are not needed anymore at the inputs.

In some embodiments, all of the PMOS devices have the same size, all of the NMOS devices marked with L for the memory storage circuits have the same size, and all of the NMOS devices marked with N for the write devices have the same size. The P devices are responsible for the clocking, the L devices are memory units, and the N devices are writing units. In other embodiments, some or all of the devices may have unique sizes relative to the remaining devices of similar or dissimilar type and/or designation.

In one embodiment, the range of the DC level of the inputs yin and vip is relative to the operation of the PMOS devices, as described herein. The DC mode at the output nodes dop, don, dqp, dqn is defined by the corresponding diode connected NMOS of the latches (Li) to a Vgs_nmos. In order to keep the circuit properly biased, the DC level of the PMOS sources is lower than the dropout of the source Ibias (VDD-Vout_bias), which means that PMOS Vgate_max is limited to VDD-Vout_bias-|Vgs_pmos|.

For the lower limit, the gate of the PMOS device is kept higher than the limit for the PMOS device to enter in a linear region. If the drain of the PMOS is at a level Vgs_nmos, then its gate cannot fall below Vgs_nmos-|Vthp|. The total DC input range for proper operation is then $$Vgs\_nmos-|Vthp|<Vdc\_inputs<VDD-Vout\_bias-|Vgs\_pmos|$$

In practice, this range may be between 0.2V and VDD-0.2V-|Vthp|. In other embodiments, this range may extend lower and/or higher than the given range.

Additionally, the minimum swing of the inputs will be related by the Bakhausen criteria for the gain of the loop created in the latches biased with Ibias/2. If the DC point is provided, and the current Ibias is set accordingly, then the biased divider circuit 140 works properly with small input signals. Accordingly, there is no need for rail-rail inputs with the biased divider circuit 140.

Figure 5:
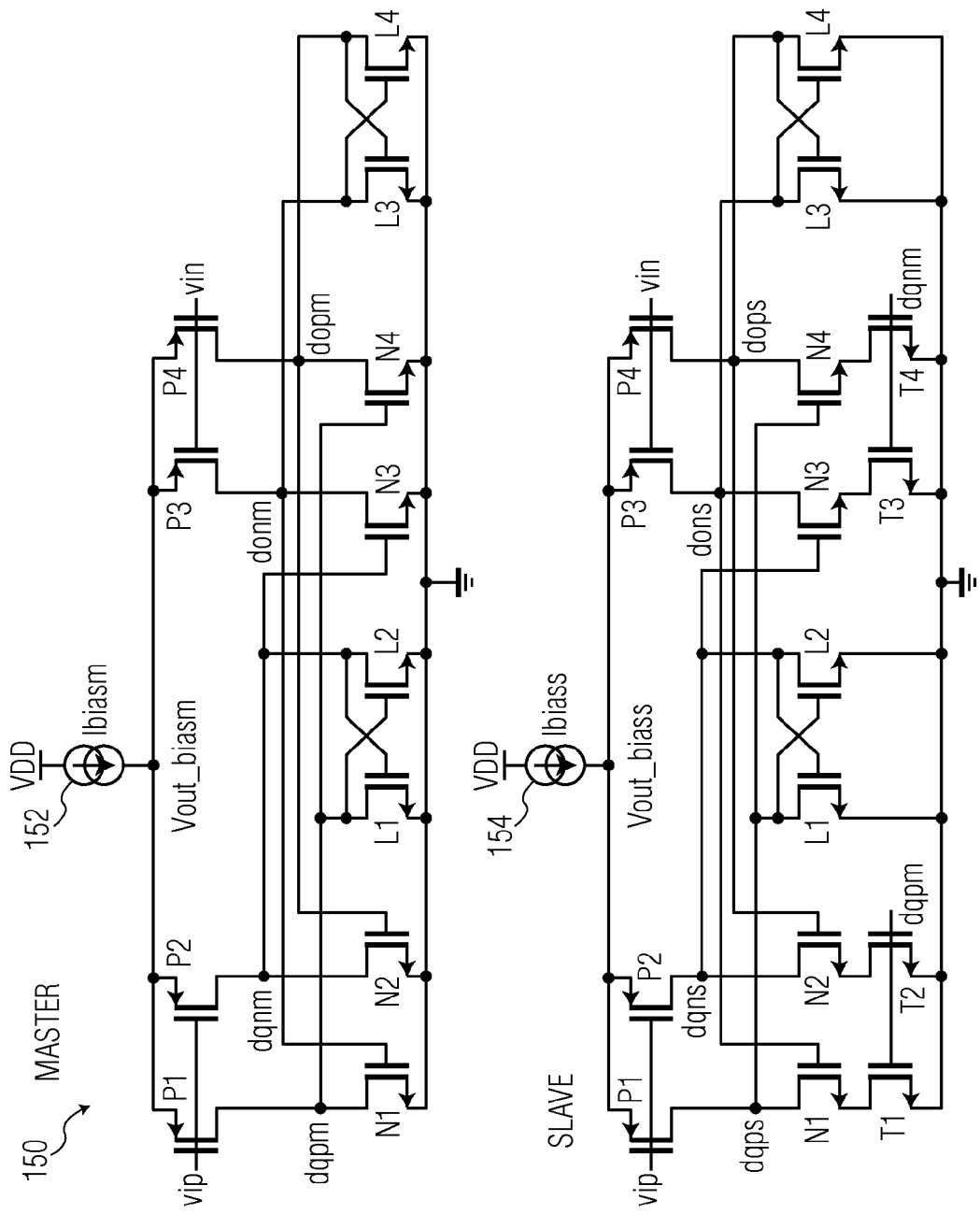
FIG. 5 depicts a schematic circuit diagram of another embodiment of a biased divider circuit with a master frequency divider and a slave frequency divider for divide-by-4 frequency division.

FIG. 5 depicts a schematic circuit diagram of another embodiment of a biased divider circuit 150 with a master frequency divider and a slave frequency divider for divide-by-4 frequency division. Each of the master and slave frequency dividers includes a current source bias 152 and 154, similar to the current source bias of FIG. 4.

Both the master frequency divider and the slave frequency divider are implemented as modified Razavi dividers. The master frequency divider generates 4 clock phases that are used to reconfigure the slave frequency divider. Specifically, the outputs dqpm and dopm from the master frequency divider are input to control switches T1-T2 and T3-T4, respectively, of the slave frequency divider. These series switches T1-T4 of the slave frequency divider control the operation of the write devices N1-N4 of the slave frequency divider. The function of these series switches is to control when each write cycle outputs from the slave frequency divider, depending the status of the outputs from the master frequency divider.

In some embodiments, the delay and/or oscillation conditions of the master frequency divider and/or the slave frequency divider are adjusted using the current source biases Ibiasm and Ibiass. By controlling the operating parameters of the current source biases, in one embodiment the series switches T1 and T2 prevent the left side flip-flop (L1 and L2) of the slave frequency divider from switching states if the signal dqpm is low (however the convention designating active signal levels could be different in other embodiments). Consequently, the branches dqps and dqns in the slave frequency divider only update every two input clocks at the rising edge. The same behavior can be observed for the right side flip-flop (L3 and L4) in the slave frequency divider with respect to the signal dqnm acting on the series switches T3 and T4.

In some embodiments, the loop connection of both left and right side flip-flops creates a divide-by-4 behavior with 50% duty cycle waveforms at the outputs of the slave frequency divider. Other embodiments may be implemented to produce a divide-by-4 behavior with other duty cycles.

Figure 6:
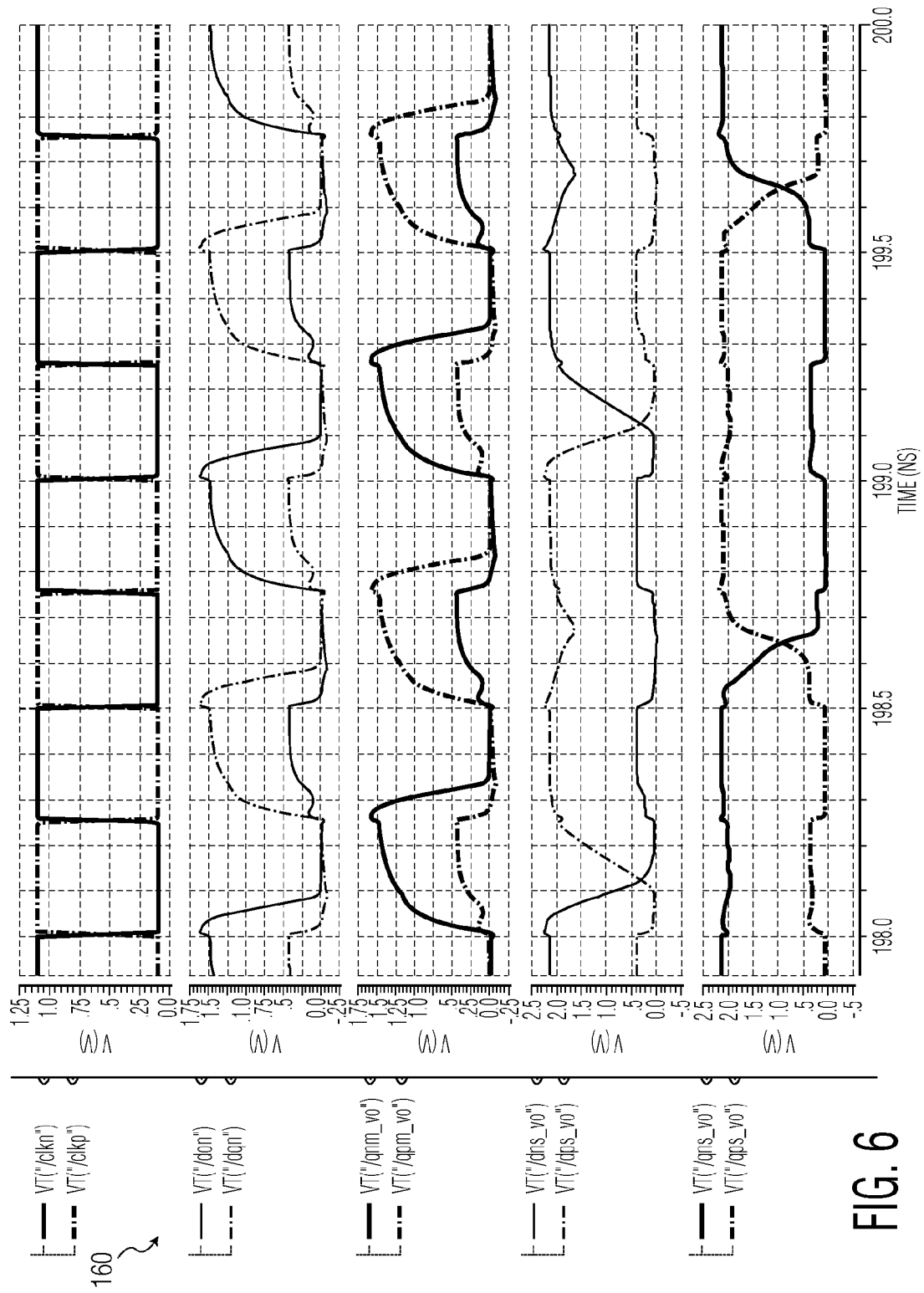
FIG. 6 depicts a signal waveform diagram of input and output signals associated with the biased divider circuit of FIG. 5.

FIG. 6 depicts a signal waveform diagram 160 of input and output signals associated with the biased divider circuit 150 of FIG. 5. The first pair of waveforms represents the input signals to the master frequency divider. The second pair of waveforms represents the donm and dopm outputs of the master frequency divider. Similarly, the third pair of waveforms represents the dqnm and dqpm outputs of the master frequency divider.

The fourth pair of waveforms represents the dons and dops outputs of the slave frequency divider. These outputs are determined by the switches T3 and T4, which are controlled by the dqnm output from the master frequency divider. The fifth pair of waveforms represents the dqns and dqps outputs of the slave frequency divider. These outputs are determined by the switches T1 and T2, which are controlled by the dqpm output from the master frequency divider.

Figure 7:
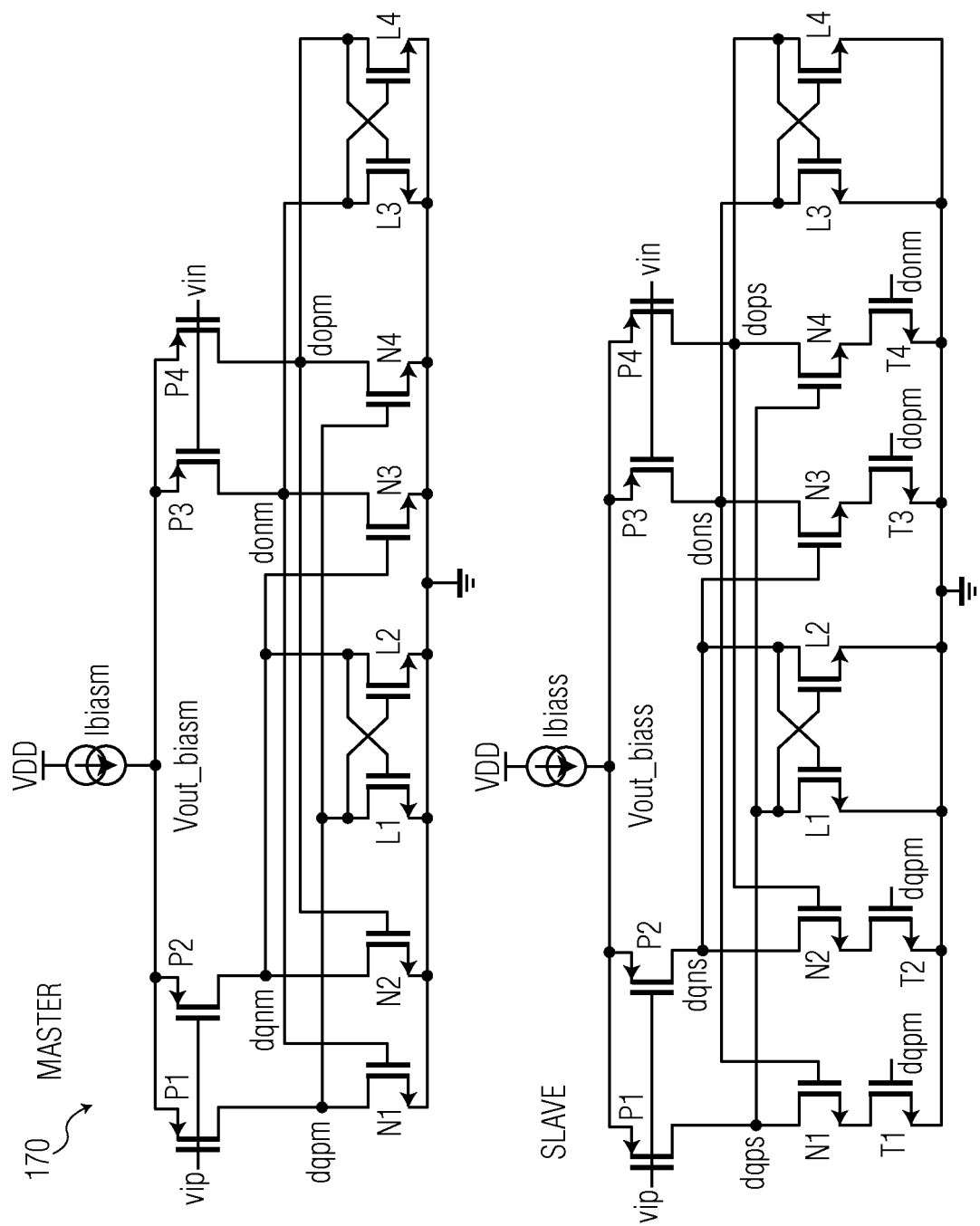
FIG. 7 depicts a schematic circuit diagram of another embodiment of a biased divider circuit with a master frequency divider and a slave frequency divider for divide-by-6 frequency division.

FIG. 7 depicts a schematic circuit diagram of another embodiment of a biased divider circuit 170 with a master frequency divider and a slave frequency divider for divide-by-6 frequency division. The master frequency divider shown in FIG. 7 is substantially the same as the master frequency divider shown in FIG. 5 and described above. The slave frequency divider shown in FIG. 7 is similar to the slave frequency divider shown in FIG. 5, except that the series switches T1-T4 are controlled differently.

In the biased divider circuit 170, each of the series switches T1-T4 are independently controlled by one of the outputs (dopm, donm, dqpm, dqnm) from the master frequency divider. In the illustrated embodiment, the outputs of the master frequency divider have four clock phases that are used to reconfigure the slave frequency divider to perform division by a factor of six relative to the input signals at the master frequency divider. In order to create the divide-by-6 mode, all the phases of the master frequency divider are used to reconfigure the slave frequency divider. Using the complementary phases dqpm and dqnm from the master slave divider for the left side flip-flop (L1 and L2) in the slave frequency divider creates an update in the flip-flop every three pulses of the combined dqpm+dqnm signal. In the same way, the phases dopm and donm allow updates every three pulses of the combined signal dopm+donm in the right side flip-flop (L3 and L4) of the slave frequency divider.

For the left side flip-flop (L1 and L2) of the slave frequency divider, the output dqpm from the master frequency divider controls the series switch T1, which determines the output dqps from the slave frequency divider. Similarly, the output dqnm from the master frequency divider controls the series switch T2, which determines the output dqns from the slave frequency divider.

For the right side flip-flop (L3 and L4) of the slave frequency divider, the inverted phases (instead of the complementary phases) from the master frequency divider are used to control the series switches. Specifically, the output dopm from the master frequency divider controls the series switch T3, which determines the output dons from the slave frequency divider. Similarly, the output donm from the master frequency divider controls the series switch T4, which determines the output dops from the slave frequency divider.

This inverse control for the series switches T3 and T4 achieves a 90 degree phase shift between the left and right flip-flops of the slave frequency divider. This phase shift is achieved by using the complementary phases for the right side flip-flop and the inverted order in the control signals used in the right side flip-flop.

Closing the loop between both flip-flops creates a 50% duty-cycle signal with divide-by-6 frequency at the outputs of the slave frequency divider. Other embodiments may be implemented to produce a divide-by-6 behavior with other duty cycles.

Figure 8:
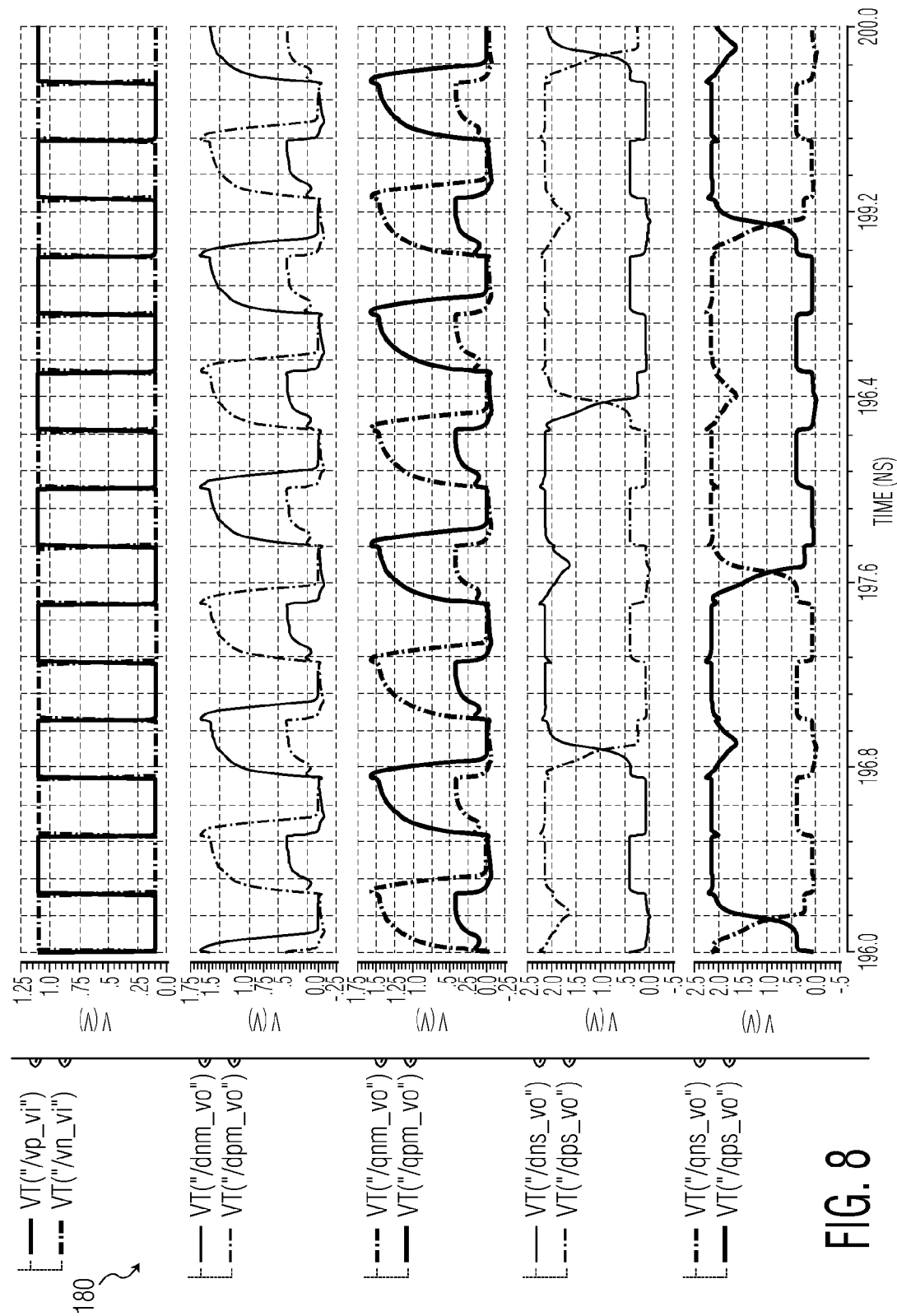
FIG. 8 depicts a signal waveform diagram of input and output signals associated with the biased divider circuit of FIG. 7.

FIG. 8 depicts a signal waveform diagram 180 of input and output signals associated with the biased divider circuit 170 of FIG. 7. The first pair of waveforms represents the input signals to the master frequency divider. The second pair of waveforms represents the donm and dopm outputs of the master frequency divider. Similarly, the third pair of waveforms represents the dqnm and dqpm outputs of the master frequency divider.

The fourth pair of waveforms represents the dons and dops outputs of the slave frequency divider. These outputs are determined by the switches T3 and T4. As explained above, the series switch T3 is controlled by the dopm output from the master frequency divider, and the series switch T4 is controlled by the donm output from the master frequency divider. These are the inverted control signals.

The fifth pair of waveforms represents the dqns and dqps outputs of the slave frequency divider. These outputs are determined by the switches T1 and T2. As explained above, the series switch T1 is controlled by the dqpm output from the master frequency divider, and the series switch T2 is controlled by the dqnm output from the master frequency divider. These are the complementary control signals.

Figure 9:
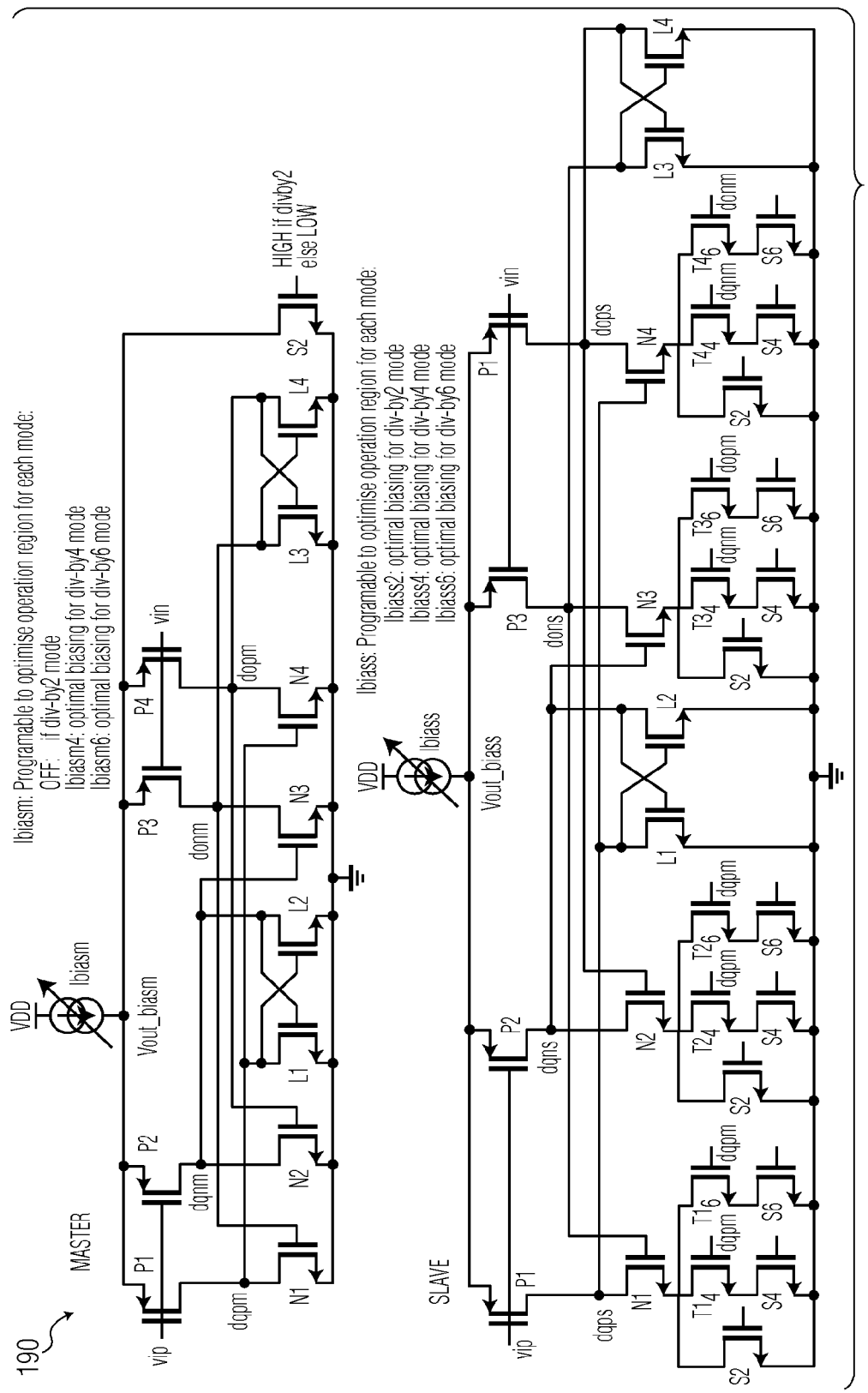
FIG. 9 depicts a schematic circuit diagram of one embodiment of a multi-modulus biased divider circuit.

FIG. 9 depicts a schematic circuit diagram of one embodiment of a multi-modulus biased divider circuit 190. The illustrated multi-modulus biased divider circuit 190 includes a master frequency divider and a slave frequency divider.

The master frequency divider is similar to the master frequency dividers of FIGS. 5 and 7, except that the master frequency divider of FIG. 9 also includes a bypass switch S2. Similarly, the slave frequency divider also includes bypass switches S2 to bypass the divide-by-4 and divide-by-6 switching circuitry, which is described in more detail below.

The divide-by-2 mode is achieved by reconfigurating the circuit so that the master divider is disabled and the slave divider is simplified to the modified Razavi divider in FIG. 4. The bypass switch S2 of the master frequency divider is enabled and shorts the Vout_bias node to avoid floating nodes which can be problematic. All the divide-by-4 and divide-by-6 programmability of the slave frequency divider is also bypassed by the S2 switches. Additionally, the current source bias Ibiasm of the master frequency divider is switched off. In this mode, the input to the master frequency divider is only a capacitive load seen at the inputs. In the slave frequency divider, the bypass switches S2 are closed, which makes the divider as simple as the biased frequency divider circuit 140 of FIG. 4. The outputs of the slave frequency divider have half the input frequency with a duty cycle close to 25% that can be corrected later on in a radio frequency (RF) amplification chain or other downstream circuitry. The control switches S4 and S6 do not a major effect, but may be opened during operation in the divide-by-2 mode.

The slave frequency divider of the multi-modulus biased divider circuit 190 is similar to the combined slave frequency dividers of FIGS. 5 and 7. In particular, there are redundant series switch T1-T4, which are designated as $T1_4$-$T4_4$ and $T1_6$-$T4_6$. The first set of the series switches $T1_4$-$T4_4$ is used to achieve divide-by-4 frequency division, while the second set of the series switches $T1_6$-$T4_6$ is used to achieve the divide-by-6 frequency division. Gate control signals for the series switches $T1_4$-$T4_4$ and $T1_6$-$T4_6$ is similar to the embodiments described above. Corresponding control switches S4 and S6 are provided in series with each series switch $T1_4$-$T4_4$ and $T1_6$-$T4_6$ in order to control when each switch is turned on or off.

The divide-by-4 mode may be achieved by configuring the master frequency divider in active mode (with the bypass switch S2 open) and the slave frequency divider to respond to operations of the $T1_4$-$T4_4$ control switches. This means that control switches S4 are closed, and the bypass switches S2 and the control switches S6 are opened. The biasing for both the master frequency divider and the slave frequency divider can be adjusted for the divide-by-4 mode. The outputs of the SLAVE divider have a fourth of the input frequency with a 50% duty cycle.

The divide-by-6 mode is achieved by configuring the master frequency divider in active mode (with the bypass switch S2 open) and the slave frequency divider to respond to operations of the $T1_6$-$T4_6$ control switches. This means that the control switches S6 are closed, and the bypass switches S2 and the control switches S4 are opened. The biasing for both master frequency divider and the slave frequency divider can be adjusted for the divide-by-6 mode. The outputs of the slave frequency divider have a sixth of the input frequency with a 50% duty cycle.

The embodiments presented in FIG. 9 allows frequency division operations for multiple division factors or ratios (divide-by-2, divide-by-4, and divide-by-6) directly at the output of a VCO 102 (see FIG. 1) or other signal source. Embodiments of the multi-modulus biased divider circuit 190 can adapt automatically to the common-mode at the input, which makes the circuit very suitable for frequency division right at the output of a VCO 102, without the need of an additional buffer or DC bias network. In some embodiments, the multi-modulus biased divider circuit 190 is capable of operating at high speed with low power, which allows important reduction in the current consumption of the local oscillator.

In one embodiment, the current source biases Ibiasm and Ibiass are programmable in order to relax the needs for oscillation condition and delay. This allows the multi-modulus biased divider circuit 190 to integrate the three modes in one single circuit.

Although the illustrated multi-modulus biased divider circuit 190, other embodiments may integrate fewer or more modes into a single circuit. In further embodiments, other division factors may be integrated into multi-modulus biased divider circuits.

In some embodiments, other combinations for the phases of the master divider controlling the slave divider may be implemented to achieve different functionality. For example, some embodiments implement divide-by-tw modes divide-by-four modes without a 50% duty cycle for one pair of slave outputs. In other embodiments, some divide-by-four modes have 50% duty-cycle for both pairs of outputs, but not always with a phase shift of 90 degrees between them. Further, some embodiments have quadrature outputs (i.e., 90 degree phase shift between output pairs). Other embodiments may implement further permutations of the control signals from the master to achieve an operational divide-by-four or divide-by-six operation without quadrature. Ultimately, there are many ways that the control signals may be manipulated to achieve a variety of outputs with different frequency and phase characteristics, all of which fall within the scope of the present description.

In some embodiments, the master and slave dividers may be biased together with a common current source connected between VDD and all the sources of the PMOS transistors. The amount of current, the DC level of the inputs and the effective Vgs of the combined PMOS transistors creates a virtual 'VDD' supply level at the output of the common current source. However, it is possible that the input voltage swing at the PMOS gates of such a configuration may create a ripple at the virtual 'VDD' which can disturb circuit operation. To deal with such disturbance, some embodiments may include a capacitor connected to a ground reference in order to filter the virtual 'VDD' node. This type of configuration has some similarities to the original Razavi divider circuit (see FIG. 2), including a low impedance "VDD" created by the capacitor. Also the current must be set large enough for operation of both dividers so that the optimization of the biasing for each divider may be achieved by the size of the input PMOS transistor. In some embodiments, different steps may be applied to define what amount of current is needed. Embodiments of this configuration may be suitable for larger input signals.

In some embodiments, all four outputs of the slave frequency divider can be used to create a divided output signal with four phases in quadrature.

In some embodiments, only two complementary outputs of the slave frequency divider are used or needed to output the divider signals. Some embodiments may require the use of a differential buffer, and the load presented by the buffer must be taken into account so that the symmetry of the divider is preserved as much as possible. This can be done by arranging or optimizing size and layout parameters of the circuitry. Some examples of optimizations or adjustments may be achieved by considering the implementation details of the embodiment. For instance, the amount of additional switches in the slave divider makes the divider always slower than the master so that the current Ibiasm may be lower relative to the current Ibiass. Also, the PMOS input transistors in the master divider may be bigger because of the higher capacitive load created by the switches T1-T4 in the slave divider.

In some implementations, there may be asymmetries created in the layout. Also, the outputs may be bufferized to be used downstream. In some embodiments, the buffer uses two outputs if the quadrature is not required so the loading of the divider also will be asymmetric. This yields to qualitative differences in the signals so that the best pair of slave output signals to be used (depending on certain characteristics of each pair) could be either dqps–dqns or dops–dons.

Also, there is a known characteristic or plot in frequency dividers called the sensitivity curve. This is a plot relating the frequency range that can be divided versus the input power applied. In other words, the signal level at the input versus the range of frequencies for proper operation. Embodiments of the sensitivity curve looks like an inverted triangle with a smaller range for lower input signals and a bigger range when the input power increases. This kind of plot may be used to optimize or adjust the biasing and the sizes of the divider around a specific center frequency.

Figure 10:
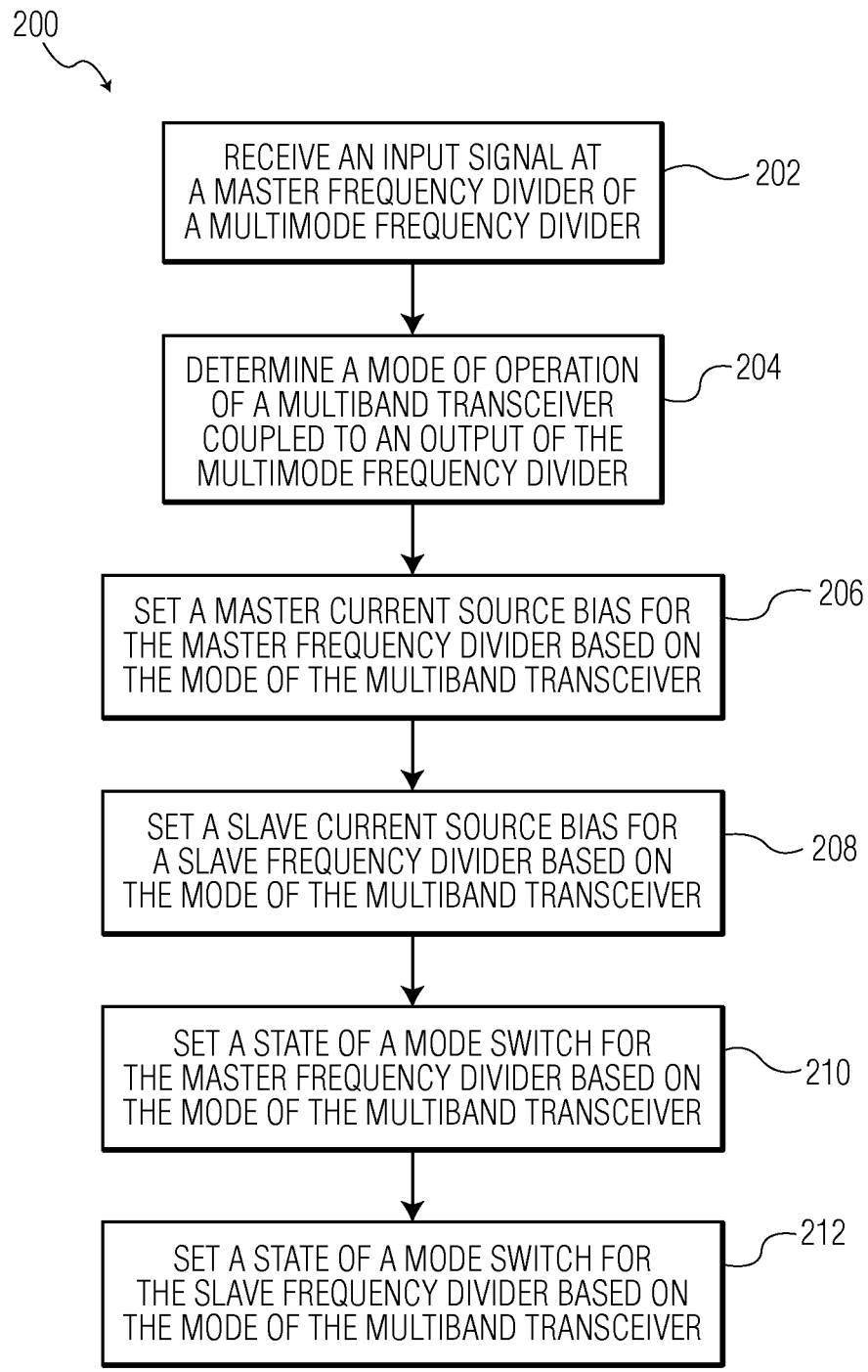
FIG. 10 depicts a flowchart diagram of one embodiment of a method for controlling the multi-modulus biased divider circuit of FIG. 9.

FIG. 10 depicts a flowchart diagram of one embodiment of a method 200 for controlling the multi-modulus biased divider circuit 190 of FIG. 9. The illustrated method 200 is described with reference to the multi-modulus biased divider circuit 190. However, embodiments of the method 200 may be implemented with other multi-modulus biased divider circuits.

The depicted method 200 begins as the multi-modulus biased divider circuit 190 receive 202 an input signal at the master frequency divider. The controller 106 may determine 204 a mode of operation of a multiband transceiver (not shown) coupled to an output of the multi-modulus biased divider circuit 190. Based on the operating mode of the multiband transceiver or other connected circuitry, the controller 106 sets 206 a master current source bias for the master frequency divider. The controller 106 also sets 208 a slave current source bias for the slave frequency divider based on the operating mode of the multiband transceiver or other connected circuitry. The controller 106 also sets 210 the state of one or more mode switches (e.g., the bypass switches S2 and/or the control switches S4 and S6) for the master frequency divider. Similarly, the controller 106 sets 212 the state of one or more mode switches (e.g., the bypass switches S2 and/or the control switches S4 and S6) for the slave frequency divider. The depicted method 200 then ends. At this point, the multi-modulus biased divider circuit 190 may begin operations to generate the divided frequency signals based on the input signal, the current source bias signals, and the states of the mode switches within the master and slave frequency dividers.

Although separate operations are described above for configuring the dividers, or portions thereof, two or more configuration operations may occur together simultaneously or at approximately the same time relative to other operations. For example, both dividers may be configured in a single operation using common control lines for the switching elements.

Embodiments described herein may include at least one controller coupled directly or indirectly to memory elements through a system bus such as a data, address, and/or control bus. The memory elements can include local memory employed during actual execution of program code, bulk storage, and cache memories which provide temporary storage of at least some program code in order to reduce the number of times code must be retrieved from bulk storage during execution.

It should also be noted that at least some of the operations for the methods described herein may be implemented using software instructions stored on a computer useable storage medium for execution by a computer. As an example, an embodiment of a computer program product includes a computer useable storage medium to store a computer readable program that, when executed on a computer, causes the computer to perform operations as described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A frequency divider comprising:
   a master frequency divider comprising:
      clocking transistor devices to receive a differential input signal having a first frequency at an input of the frequency divider;
      memory transistor circuits coupled to the clocking transistor devices to store signals based on the differential input signal from the clocking transistor devices;
      write transistor devices coupled to memory transistor circuits to make a divided frequency signal available at a plurality of output terminals of the master frequency divider; and
      a current source bias coupled to the clocking transistor devices, wherein the current source bias is configured to apply a bias current to adapt the frequency divider to a common-mode at the input of the frequency divider; and
   a slave frequency divider comprising:
      slave clocking transistor devices to receive the differential input signal;
      slave memory transistor circuits coupled to the slave clocking transistor devices;
      slave write transistor devices coupled to the slave memory transistor circuits to make a secondary divided frequency signal available at a plurality of slave output terminals of the slave frequency divider;
      control switches for controlling an operation of the slave write transistor devices by controlling when each write cycle of the slave frequency divider outputs from the slave frequency divider depending on the status of the outputs from the master frequency divider, wherein each control switch is coupled to one of the output terminals of the master frequency divider; and
      a slave current source bias coupled to the slave clocking transistor devices, wherein the slave current source bias is configured to apply a slave bias current.

2. The frequency divider of claim 1, wherein the clocking transistor devices, the memory transistor circuits, and the write transistor devices of the master frequency divider are arranged to form a Razavi divider.

3. The frequency divider of claim 1, wherein the master frequency divider is further configured to operate with the differential input signal having a peak-to-peak amplitude that is less than a rail-to-rail amplitude.

4. The frequency divider of claim 1, wherein a direct current (DC) level of the clocking transistor devices of the master frequency divider is kept lower than a dropout of the current source bias.

5. The frequency divider of claim 1, wherein a gate of each clocking transistor device of the master frequency divider is kept higher than a limit for the clocking transistor devices to enter a linear region of operation.

6. The frequency divider of claim 1, wherein the divided frequency signal available at the output terminals has a frequency equal to the differential input signal divided by two.

7. The frequency divider of claim 1, wherein the slave frequency divider further comprises mode switches coupled to the slave write transistor devices to control a multimode operation of the frequency divider, wherein each mode of the multimode operation has a unique division factor relative to the differential input signal, and wherein:

in a first mode, the secondary divided frequency signal available at the slave output terminals has a frequency equal to the differential input signal divided by two;

in a second mode, the secondary divided frequency signal available at the slave output terminals has a frequency equal to the differential input signal divided by four; and in a third mode, the secondary divided frequency signal available at the slave output terminals has a frequency equal to the differential input signal divided by six.

8. The frequency divider of claim 7, further comprising a controller coupled to the current source bias, wherein the controller is configured to operate the current source bias according to one of a plurality of programmed biasing states corresponding to each mode of the multimode operation.

9. The frequency divider of claim 1, wherein:
each pair of the slave write switches is coupled together to a single output terminal of the master frequency divider; and
the secondary divided frequency signal available at the slave output terminals has a frequency equal to the differential input signal divided by four.

10. The frequency divider of claim 1, wherein:
each of the slave write switches is individually coupled to a single output terminal of the master frequency divider; and
the secondary divided frequency signal available at the slave output terminals has a frequency equal to the differential input signal divided by six.

11. A multiband communication circuit comprising:
a high frequency voltage-controlled oscillator (VCO) to output a high frequency clock signal;
a multimode frequency divider coupled to an output of the high frequency VCO, wherein the multimode frequency divider comprises;
  a master frequency divider comprising:
    clocking transistor devices to receive a differential input signal having a first frequency at an input of the multimode frequency divider;
    memory transistor circuits coupled to the clocking transistor devices to store signals based on the differential input signal from the clocking transistor devices;
    write transistor devices coupled to memory transistor circuits to make a divided frequency signal available at a plurality of output terminals of the master frequency divider; and
    a current source bias coupled to the clocking transistor devices, wherein the current source bias is configured to apply a bias current to adapt the frequency divider to a common-mode at the input of the multimode frequency divider; and
  a slave frequency divider comprising:
    slave clocking transistor devices to receive the differential input signal;
    slave memory transistor circuits coupled to the slave clocking transistor devices;
    slave write transistor devices coupled to the slave memory transistor circuits to make a secondary divided frequency signal available at a plurality of slave output terminals of the slave frequency divider;
    control switches for controlling an operation of the slave write transistor devices by controlling when each write cycle of the slave frequency divider outputs from the slave frequency divider depending on the status of the outputs from the master frequency divider, wherein each control switch is coupled to one of the output terminals of the master frequency divider; and
    a slave current source bias coupled to the slave clocking transistor devices, wherein the slave current source bias is configured to apply a slave bias current; and
a multiband transceiver coupled to an output of the multi mode frequency divider.

12. The multiband communication circuit of claim 11, wherein the multimode frequency divider is coupled directly to output of the high frequency VCO.

13. The multiband communication circuit of claim 11, wherein the multiband communication circuit is configured to operate in an absence of a buffer at the output of the high frequency VCO.

14. The multiband communication circuit of claim 11, wherein the multimode frequency divider is configured to automatically adapt to a common-mode at an input of the multimode frequency divider for compatibility with the high frequency VCO.

15. A method comprising:
receiving a differential input signal at a multimode frequency divider, wherein the multimode frequency divider comprises:
  a master frequency divider comprising:
    clocking transistor devices to receive a differential input signal having a first frequency at an input of the frequency divider;
    memory transistor circuits coupled to the clocking transistor devices to store signals based on the differential input signal from the clocking transistor devices;
    write transistor devices coupled to memory transistor circuits to make a divided frequency signal available at a plurality of output terminals of the master frequency divider; and
    a current source bias coupled to the clocking transistor devices, wherein the current source bias is configured to apply a bias current to adapt the frequency divider to a common-mode at the input of the multimode frequency divider; and
  a slave frequency divider comprising:
    slave clocking transistor devices to receive the differential input signal;
    slave memory transistor circuits coupled to the slave clocking transistor devices;
    slave write transistor devices coupled to the slave memory transistor circuits to make a secondary divided frequency signal available at a plurality of slave output terminals of the slave frequency divider;
    control switches for controlling an operation of the slave write transistor devices by controlling when each write cycle of the slave frequency divider outputs from the slave frequency divider depending on the status of the outputs from the master frequency divider, wherein each control switch is coupled to one of the output terminals of the master frequency divider; and
    a slave current source bias coupled to the slave clocking transistor devices, wherein the slave current source bias is configured to apply a slave bias current;
applying a first current source bias to a supply voltage line of the multimode frequency divider to output a first output signal with a first divided frequency relative to the differential input signal; and applying a second current source bias to the supply voltage line of the multimode frequency divider to output a second output signal with a second divided frequency relative to the differential input signal and the first divided frequency.

\* \* \* \* \*